United States Patent [19]
Choi

[11] Patent Number: 6,034,892
[45] Date of Patent: Mar. 7, 2000

[54] NONVOLATILE MEMORY CELL AND METHOD FOR PROGRAMMING AND/OR VERIFYING THE SAME

[75] Inventor: Woong Lim Choi, Chungcheongbuk-do, Rep. of Korea

[73] Assignee: LG Semicon Co., Ltd., Cheongju, Rep. of Korea

[21] Appl. No.: 08/898,689

[22] Filed: Jul. 22, 1997

[30] Foreign Application Priority Data

Jul. 23, 1996 [KR] Rep. of Korea ............... 96-296951

[51] Int. Cl.⁷ ................................. G11C 16/04
[52] U.S. Cl. ................ 365/185.14; 365/185.28; 365/185.01
[58] Field of Search ............ 365/230.01, 189.01, 365/185.1, 185.01, 185.14, 185.28

[56] References Cited

U.S. PATENT DOCUMENTS

| | | | |
|---|---|---|---|
| 4,931,847 | 6/1990 | Corda | 357/23.5 |
| 5,040,147 | 8/1991 | Yoshizawa et al. | 365/185.01 |
| 5,043,940 | 8/1991 | Harari | 365/168 |
| 5,084,745 | 1/1992 | Iizuka | 357/23.5 |
| 5,303,187 | 4/1994 | Yu | 365/185.01 |
| 5,338,952 | 8/1994 | Yamauchi | 257/315 |
| 5,422,842 | 6/1995 | Cernea | 365/185 |
| 5,557,566 | 9/1996 | Ochii | 357/23.5 |
| 5,583,811 | 12/1996 | Van Houldt et al. | 365/185.15 |
| 5,614,747 | 3/1997 | Ahn et al. | 257/316 |
| 5,668,757 | 9/1997 | Teng | 365/185.1 |
| 5,757,700 | 5/1998 | Kobayashi | 365/189.01 |
| 5,789,777 | 8/1998 | Kojima | 257/314 |

*Primary Examiner*—Viet Q. Nguyen
*Attorney, Agent, or Firm*—Fleshner & Kim

[57] ABSTRACT

Nonvolatile memory device and a method of programming the same, is disclosed, wherein, for single level or multi-level programming of a cell, predetermined voltages are applied to a control gate, source and drain respectively for varying a charge amount in the floating gate. A channel in a transistor is turned off at an initial stage and then turned on thereafter, and at least one of the voltages applied to the control gate and the program/select gate is halted to stop the programming when a conductivity of the channel region reaches a reference value.

20 Claims, 12 Drawing Sheets

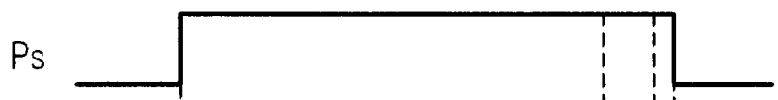
FIG.5A  Ps
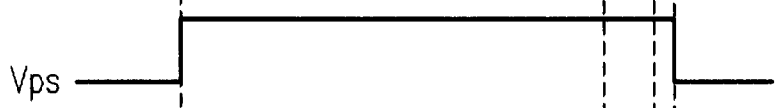
FIG.5B  Vps
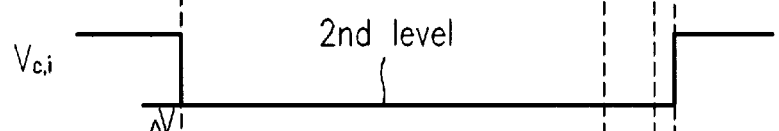
FIG.5C  Vc,i
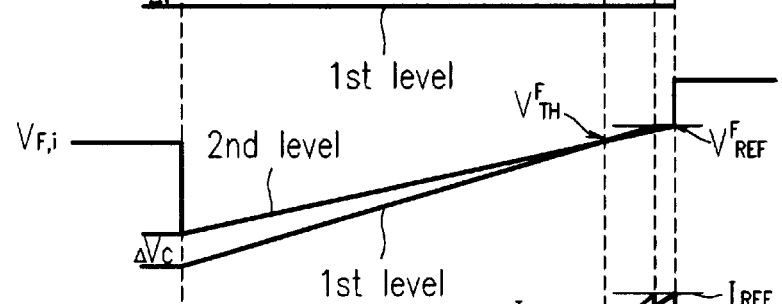
FIG.5D  VF,i
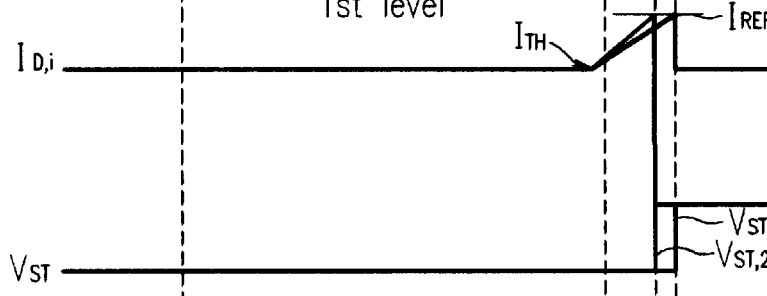
FIG.5E  ID,i
FIG.5F  VST
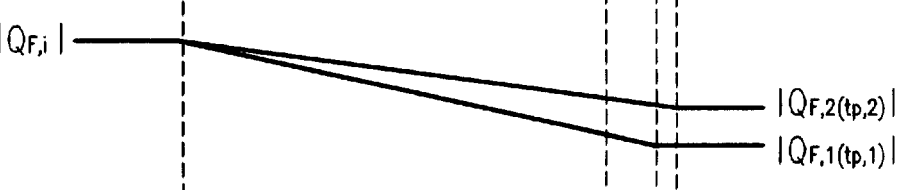
FIG.5G  |QF,i|
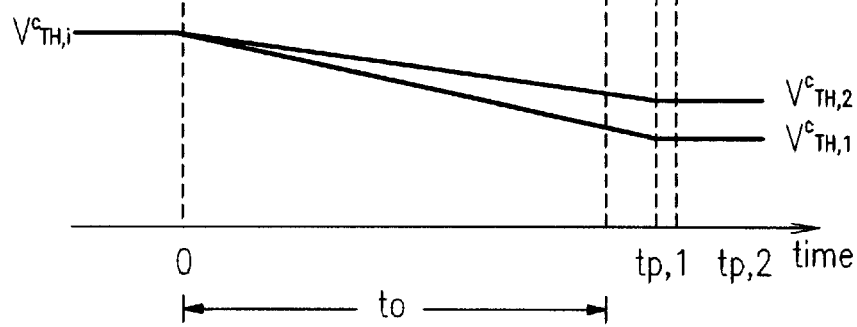
FIG.5H  V$^c$TH,i

NONVOLATILE MEMORY CELL AND METHOD FOR PROGRAMMING AND/OR VERIFYING THE SAME

BACKGROUND OF THE INVENTION

1. Field of the Invention

The present invention relates to a memory device and in particular, a nonvolatile memory device and a method of programming and/or verifying the same.

2. Background of the Related Art

The packing density of a conventional nonvolatile memory corresponds in a one to one fashion to the number of memory cells. When nonvolatile semiconductor memory devices, such as EEPROM and flash EEPROM, are used as mass storage media, it is difficult to overcome the high cost-per-bit of the memories. Further, nonvolatile memory chips of low power consumption are required for application of the nonvolatile memories to portable products. In order to lower the cost-per-bit, multibit-per-cell has been actively studied.

A multibit cell stores data of over two bits in one memory cell to enhance the density of data on the same chip area without increasing the size of the memory cell. In order to implement a multibit cell, more than two threshold voltage levels may be programmed on each memory cell. For example, in order to store data of two bits for every cell, the respective cells must be programmed in $2^2$ (four) threshold levels. The four threshold levels correspond to logic states 00, 01, 10, and 11, respectively. However, a problem arises due to statistical distribution value of about 0.5 V during the multi-level programming.

The distribution is reduced by precisely setting the respective threshold levels, and more levels can be programmed, which increases the number of bits per cell. To reduce the voltage distribution, repeated programming and verification are performed in the conventional method. For programming, a series of voltage pulses are applied to the cells to adjust the threshold levels. To verify whether a cell has reached an intended threshold level, a read operation is performed between the respective programming voltage pulses. Programming and verification are completed when the verified threshold level reaches the intended threshold level.

In the conventional method of repeated programming and verification, there is some difficulty in reducing the error distribution of the threshold level due to the limited pulse width of a program voltage. Further, the algorithm of repeated programming and verification is implemented with additional circuits, which increase the area of peripheral circuits on the chip. The repetitive method prolongs the programming time. To solve such problems, R. Cernea of SunDisk Co., Ltd. suggested a method of simultaneous programming and verification in U.S. Pat. No. 5,422,842.

FIG. 1A illustrates the symbol and circuit diagram of the nonvolatile memory. The nonvolatile memory cell includes a control gate 1, floating gate 2, source 3, channel area 4, and drain 5. When voltages sufficient to cause programming are applied to control gate 1 and drain 5, a current flows between drain 5 and source 3, and electrons are injected into the floating gate 2. This current is compared to a reference current, which varies for each threshold voltage level to be programmed. The auto verification of a programmed condition at the same time as programming can compensate for the disadvantage of the repetition of the program verification to some extent. When the current reaches a value equal to or smaller than the reference current, a programming completion signal is produced.

U.S. Pat. No. 5,043,940 discloses a method for conducting multi-level programming in which voltages applied to each terminal of the memory cell are fixed while reference currents for respective levels are varied. In these methods, as shown in FIG. 1B, the relation between the reference currents for detection and the cell threshold voltages is neither explicit nor linear.

In the above method, the threshold level is not adjusted by a voltage applied to the control gate of the memory cell. Hence, a separate optimization of the operations for programming and sensing is difficult. The unseparated currents for programming and monitoring prevent direct control of the threshold voltage of cell. Accordingly, a current controlled type programming method like aforementioned prior arts has a disadvantage that a direct and effective multi-level control is also difficult.

To eliminate such problems, the present inventor suggested a programming method of a voltage control type in which precise control of the threshold voltage of a multibit cell is done by means of a voltage applied to the control gate of the cell (U.S. patent application Ser. No. 08/542,651, commonly assigned to the same assignee). According to this method, a shift of the threshold voltage of a cell is precisely identical to a shift of the control gate voltage. Therefore, the threshold voltage can be ideally adjusted. However, a channel of the transistor is turned on at the start of programming (i.e., inverted) for current flow therethrough, and a current at a drain is decreased, as the programming proceeds, until the current flow level reaches a predetermined reference current value. Since the current flow starts at the maximum current from the start of programming and decreases thereafter, the initial power consumption is high.

The cell structures of EEPROM and flash EEPROM can be classified into two types, according to the position of floating gate on the channel region. The first type is the simple stacked gate structure in which the floating gate fully covers the channel region. The second type is the split-channel structure in which the floating gate covers only a portion of the channel region between the source and drain. The channel region not covered by the floating gate thereon is functionally called a select transistor. The select transistor and the floating gate transistor are connected in series to compose a memory cell.

The split-channel type cell is also classified into two different types according to the methods for forming the select transistor. A merged-split-gate cell has a control gate electrode of the floating gate transistor and a gate electrode of the select transistor integrated into one. A split-gate-cell has the control gate electrode of the floating gate transistor and the gate electrode of the select transistor separated from each other. The select transistor prevents the problem of over erasure and allows easy formation of contactless virtual ground array. The split-gate-cell allows easier hot electron injection from the source side.

FIG. 2A illustrates a diagram of a conventional nonvolatile memory cell of simple stacked gate type, and FIG. 2B illustrates a diagram of a conventional nonvolatile memory cell of split channel type. FIGS. 2A and 2B also illustrate the program and erasure mechanisms. In FIG. 2A, the stacked gate type cell comprises a control gate 6, a floating gate 7, a source 8, a drain 9, a channel region 10 and a gate 11 for use in erasure. In FIG. 2B, the split channel type cell comprises a control gate 13, a floating gate 14, a source 15, a drain 16, a channel region 17 and a gate 18 for use in erasure.

The split-channel cell employs a hot electron injection mechanism for programming the threshold voltage level. The merged-split-gate cell employs a drain side hot electron injection mechanism while the split-gate cell employs a source side hot electron injection mechanism. The split-channel cell has more power consumption due to the hot electron injection mechanism used during programming operation compared to tunneling mechanism. There is difficulty in the merged-split-gate cell in carrying out different kinds of ion injection two times into the drain region, as required for better hot carrier injection. There is difficulty in the split-gate cell for optimizing an oxide film thickness between the select transistor and the floating gate transistor, which is required for better hot carrier injection, for appropriate flow of current during an initial read operation and for preventing the degradation of the read current caused by degradation of the oxide film.

In the conventional split-channel cell, the electron injection (programming=data writing) is carried out by hot carrier injection through a gate oxide film adjacent to a channel. The electron erasure (deletion of data) is carried out either through a third gate other than a select gate or the control gate, or through a gate oxide film adjacent to a channel, or through the control gate.

Similar to other EEPROMs, FN-tunneling is employed for erasure. In case of the aforementioned split-channel cell, a thin gate insulating film of about 100 Å is required since the cell uses tunneling through the insulating film for erasure. The thin insulating film cannot assure reliable operation and degrades control gate coupling. In other words, as the cell size is further reduced, the coupling becomes even smaller, which is not favorable for low voltage/high speed operation.

Further, the erasure gates 11 and 18 are not necessary during the programming operation, and each of the conventional cells, shown in FIGS. 2A and 2B, has a structure equivalent to a double polygate structure. Conventionally, the programming operation is conducted using only electrodes of the control gate, source and/or drain, and the current paths for programming and verifying (or sensing) within a memory cell are unseparated, such that a direct and effective multi-level control has been difficult.

The above references are incorporated by reference herein where appropriate for appropriate teachings of additional or alternative details, features and/or technical background.

SUMMARY OF THE INVENTION

It is an object of the present invention to substantially obviate one or more of the problems of the related art.

One object of the present invention is to provide a nonvolatile memory cell and a method for programming the nonvolatile memory cell which allows an easy and simultaneous verification of single or multi-level programming.

Another object of the invention is to provide a region for programming and a region for verification which are completely or substantially separated from each other.

Another object of the present invention is to provide a nonvolatile memory cell and a method for single or multi-level programming of the nonvolatile memory cell in which each threshold level is adjusted by means of a voltage applied to a control gate.

Still another object of the present invention is to provide a linear relationship between each threshold level and a corresponding voltage applied to the control gate.

A further object of the present invention is to provide a nonvolatile memory cell and a method for single or multi-level programming the nonvolatile memory cell in which simultaneous verification of a programming is available.

Another object of the present invention is to initiate a cell in a turned-off state, to monitor a state of the cell channel during the programming and to force the programming to stop at a predetermined channel state after the cell is turned-on.

A further object of the present invention is to provide a split-channel cell which uses tunneling for programming and uses hot carrier injection or tunneling for erasure.

Still another object of the present invention is to provide a nonvolatile memory cell and a method for programming the nonvolatile memory cell which minimizes the consumption of current during programming.

Still another object of the present invention is to provide a split channel cell with a gate dielectric film reliability and to improve a coupling constant.

To achieve these and other advantages and in accordance with the purpose of the present invention, as embodied and broadly described, the nonvolatile memory includes a program/select gate for acting as a terminal for selecting a cell in programming, reading and erasure and for programming in programming, a floating gate for storage of charges for storage of data and for being extracted of the charges to the program/select gate in programming, a control gate for inducing a potential at the floating gate in controlling an amount of the charges extracted from the floating gate to the program/select transistor in programming, and a transistor unit having the floating gate, the program/select gate, a channel region, a source and a drain.

In other aspect of the present invention, there is provided a method of programming a nonvolatile memory cell, which nonvolatile memory cell has a control gate, a floating gate, a program/select gate, a drain, a source, and a channel region between the drain and the source, including the steps of applying a first voltage to the control gate, applying a second voltage to the program/select gate, applying a third voltage to the drain, and applying a fourth voltage to the source, for varying an amount of charges in the floating gate so that the channel region is turned-off at an initial stage of a single level programming and is turned-on for performing the single level programming, and monitoring a conductivity of the channel region during the programming for forcing application of at least one of the first and second voltages to the control gate and the program/select gate to stop when the monitored conductivity is measured to be a predetermined reference value.

The present invention may be also achieved in part or in whole by a method of at least one of programming and verifying a memory cell to a threshold voltage level, the memory cell having a transistor with a control gate, a first gate, a second gate and first and second electrode regions and a channel region between the first and second electrode regions, comprising the steps of: accumulating charge carriers in the first gate to a first charge amount level; and transferring the charge carriers through a first current path formed between the first gate and the second gate; and monitoring one of (a) a current flow through a second current path between the first and second electrodes and (b) a potential at one of the first and second electrodes, wherein charge carriers are transferred through the first current path until one of (a) the current flow through the second current path equals a reference current and (b) the potential at one of the first and second electrodes equals a reference voltage, respectively, such that the threshold voltage level is programmed.

The present invention may be achieved in part or in whole by a semiconductor device, comprising: first and second electrodes and a channel region therebetween; a first gate for accumulating an amount of charge carriers; a second gate for selection the semiconductor device for a prescribed operation including programming a threshold voltage level of the semiconductor device; and a third gate for inducing a transfer of charge carrier from the first gate to the second gate during programming operation, wherein a first current path due to the transfer of charge carriers is separate from a second current path due to a current flowing between the first and second electrodes.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 5A–5H illustrate diagrams showing waveforms at different nodes of FIG. 4;

DETAILED DESCRIPTION OF PREFERRED EMBODIMENT(S)

In the explanations of the present invention, a programming operation is defined as a data writing operation, and an erasure operation is defined as an operation in which all the data within a block to be erased are made into the same state. Therefore, an erasure operation may result in a state in which the threshold voltage of the memory cell is either low or high. In the preferred embodiments of the present invention described hereinafter, the erasure state is defined as the highest threshold voltage level for, e.g., an N type channel FET (Field Effect Transistor).

Figure 1A:
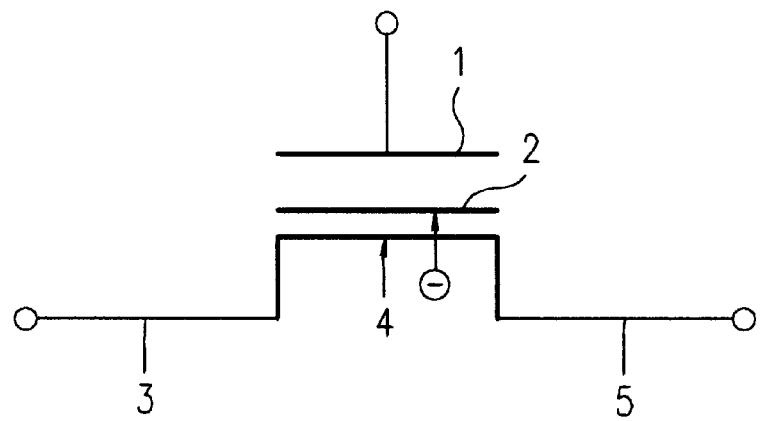
FIG. 1A illustrates a circuit of the most general nonvolatile memory cell.
Figure 1B:
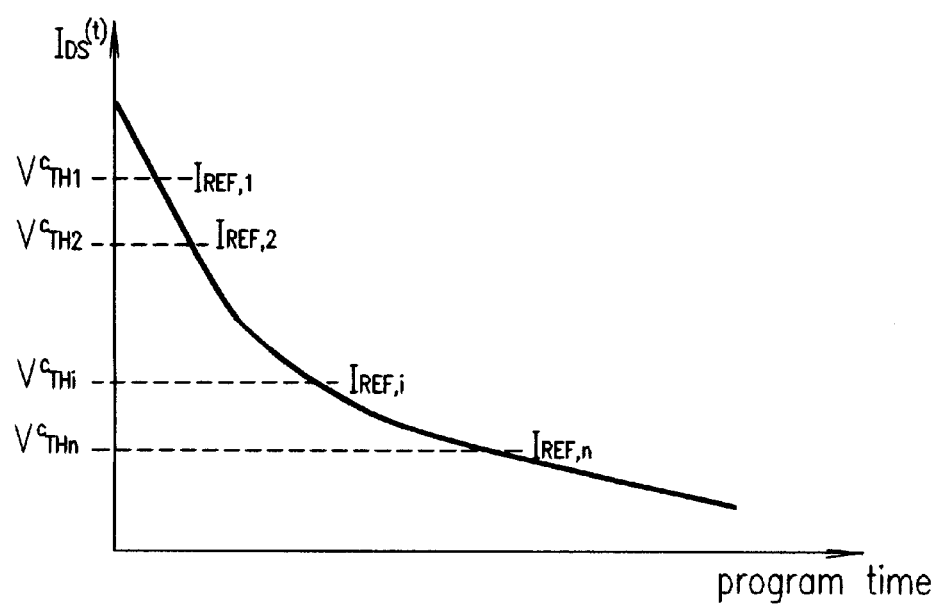
FIG. 1B illustrates a graph explaining the auto verify programming principle of the nonvolatile memory cell of FIG. 1A.
Figure 2A:
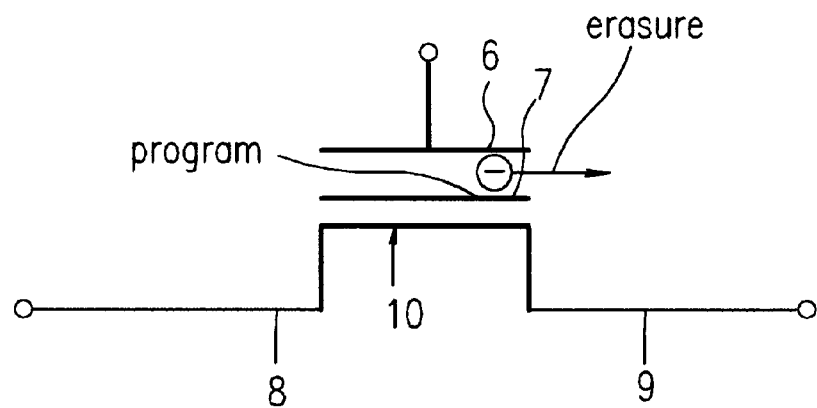
FIG. 2A illustrates a circuit of a prior art nonvolatile memory cell of simple stacked gate structure.
Figure 2B:
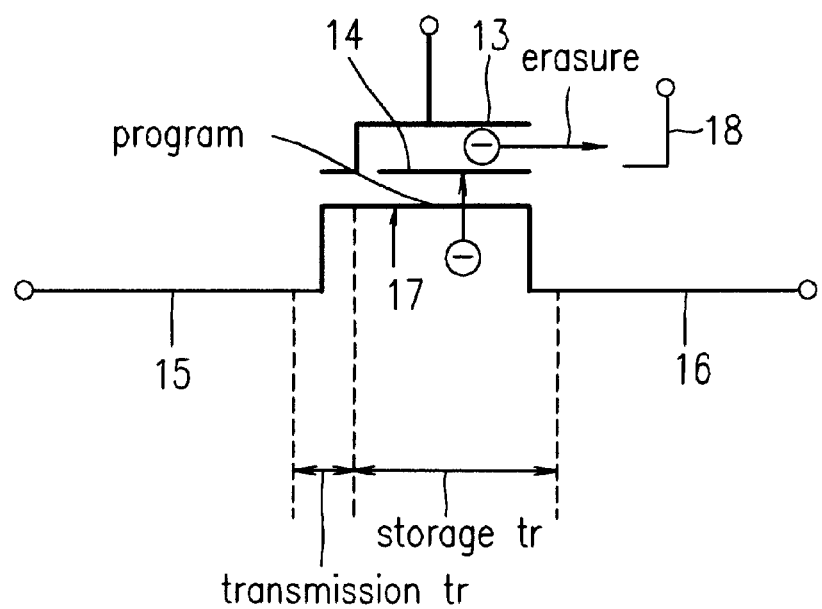
FIG. 2B illustrates a circuit of a prior art nonvolatile memory cell of split-channel structure.
Figure 3A:
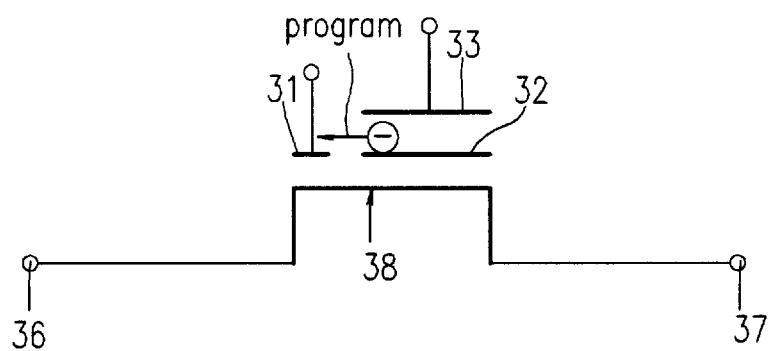
FIG. 3A illustrates a circuit of a nonvolatile memory cell in accordance with one preferred embodiment of the present invention.

FIG. 3A illustrates a diagram of a nonvolatile memory cell in accordance with one preferred embodiment of the present invention. The cell includes a program/select gate 31 for selecting a cell, for reading and writing/erasure and for programming. A floating gate 32 stores charges corresponding to stored data, and the charges are extracted from the floating gate 32 to the program/select gate 31 during the programming operation. A control gate 33 induces a potential at the floating gate 32 by a capacitive coupling, and controls the amount of the charges extracted from the floating gate 32 to the program/select gate 31.

Figure 3B:
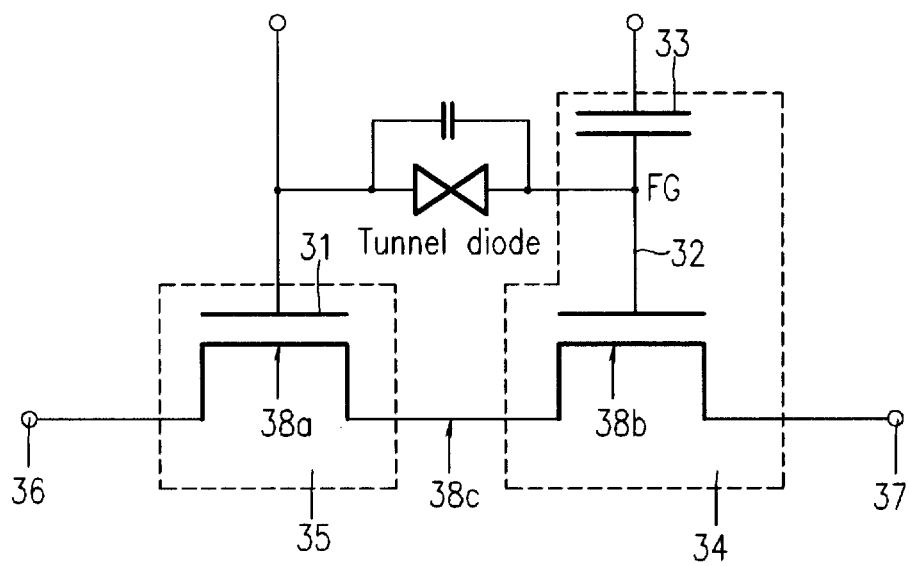
FIG. 3B illustrates a circuit showing the nonvolatile memory cell of FIG. 3A in view of its functions.

FIG. 3B illustrates a functionally equivalent schematic diagram of the nonvolatile memory cell shown in FIG. 3A. A storage transistor 34 includes a control gate 33, a floating gate 32, a channel region 38b beneath the floating gate 32, and the drain 37 stores data in the floating gate 32. The select transistor 35, including a select/program gate 31, a channel region 38a under the select/program gate 31 and a source 36, switches on or off a current flow between the drain 37 and the source 36, irrespective of the state of the threshold voltage of the storage transistor 34, thereby giving selectivity to the cell. A region 38c between the select transistor 38a and the storage transistor 38b serves as a drain for the select transistor 35 and a source for the storage transistor 34. In the source side of an N type transistor, hot electrons are generated at the channel region 38b and are injected into the floating gate 32.

The nonvolatile memory cell of the present invention has an additional feature that the select/program gate 31 and the floating gate 32 form a tunnel diode. For an N type transistor, electrons are extracted from the floating gate 32 to the select/program gate 31 through the tunnel diode, in which the program/select gate 31 serves as a terminal during the programming operation. In other words, the electrons are extracted from the floating gate 32 to the program/select gate 31.

The structural feature of the tunnel diode, and the functions and operations of the cell transistor and each terminal make the nonvolatile memory cell of the present invention novel over the prior art nonvolatile memory cell. Further, an applied voltage may be distributed to the program/select gate 31 and the control gate 33 appropriately for improving the selectivity during the programming operation of the cells in accordance with the present invention.

Figure 3C:
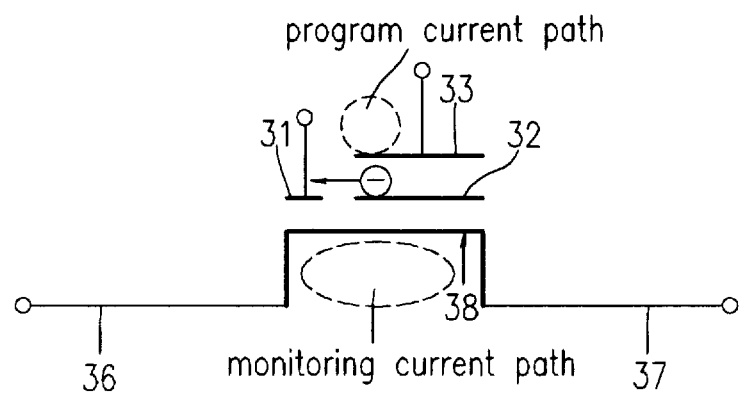
FIG. 3C illustrates a diagram showing current paths in the nonvolatile memory cell shown in FIG. 3A in programming operation.

As shown in FIG. 3C, the nonvolatile memory cell of the present invention includes a programming operation region which is completely separated from the channel region of the cell during the programming operation. That is, a programming current path and the channel current path (monitoring current path) are separated. Therefore, during the programming operation, a state of conductivity variation in the channel region 38 varied in correspondence to a charge amount variation in the floating gate 32 can be monitored at the same time and independent from the programming current path. In other words, the monitoring is conducted by the field effect transistor having the floating gate 32, select/program gate 31 and the channel gate 38. A general sense amplifier (not shown) is used to monitor a drain 37 or source 36 current of the cell.

Accordingly, the structure of the nonvolatile memory cell in accordance with the present invention has separate programming and monitoring paths during the programming operation. Hence, the memory cell of the present invention is a 4-terminal FET having the control gate 33, the source 36, drain 37 and select/program gate 31 during a programming operation. A prior art nonvolatile memory cell, however, is a 3-terminal FET. Therefore, the structure of the nonvolatile memory cell in accordance with the present invention facilitates simultaneous programming and monitoring. As can be appreciated by one of ordinary skill in the art, existing repeating program/verify methods can also be employed with the nonvolatile memory cell in accordance with the present invention.

In case of an N type transistor, an erasure operation of the nonvolatile memory cell of the present invention is an injection of electrons into the floating gate 32. Accordingly, the erasure operation may be done by a drain 37 side tunneling, or by a source side hot electron injection. For erasure using the hot carrier injection mechanism, a thin gate dielectric film between the channel region 38 or drain 37, and the floating gate 32 is not necessary to an extent required for tunneling, which allows significantly easier gate dielectric film forming process compared to existing process. Further, reliability is assured, and assumes improved coupling constant, thereby allowing a low voltage and high speed operation. Such advantages eliminate the problems of the prior art nonvolatile memory cells and avoid future problems associated with scaling-down of the nonvolatile memory cell, such as the low field leakage from tunneling and degradation of a gate oxide film. Accordingly, the nonvolatile memory cell of the present invention is favorable for scaling-down the size.

The nonvolatile memory cell of the present invention has a novel structure in which an independent selection of any one cell for either programming or erasure operation is allowed without the problems related to the reliability of cell array. During a programming operation, a selectivity is determined by the transistor having the control gate 33 and the drain 37. For example, in case of an N type transistor, programming can be done by a tunneling through the tunnel diode, and erasure can be done by a source side hot electron injection for an N-type transistor. In other words, the memory cell of the present invention may be used as an EEPROM or a flash EEPROM.

Figure 4:
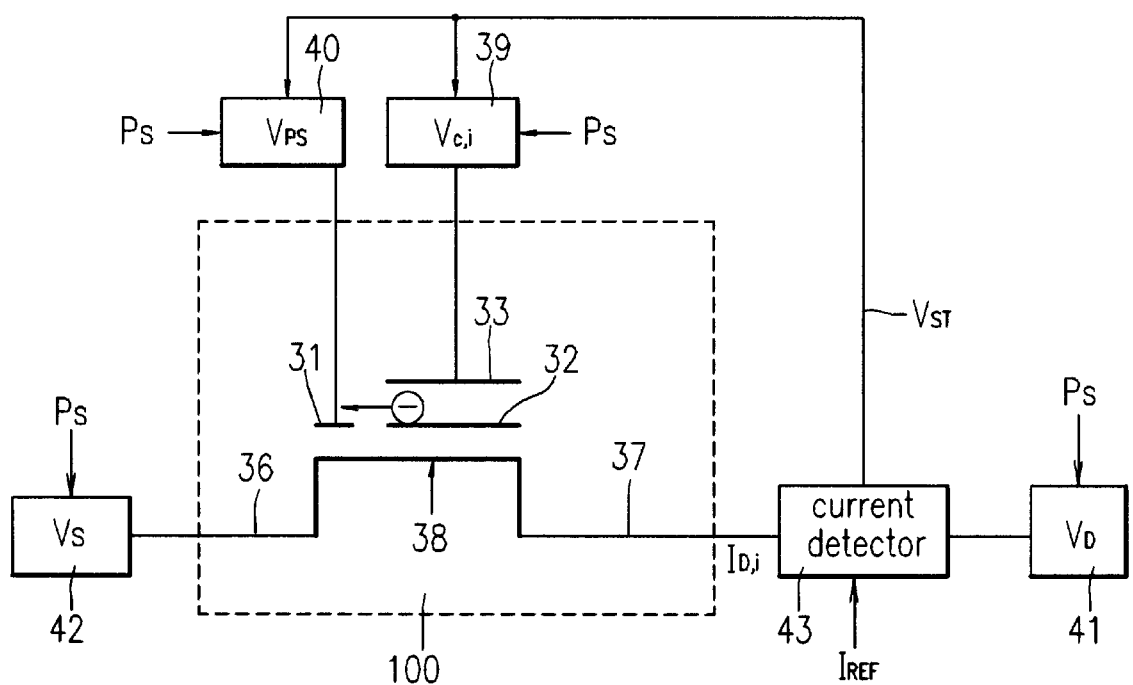
FIG. 4 illustrates a diagram showing a process of the current detection method for programming a nonvolatile memory cell.

Methods for single or multi-level programming and/or verification of the nonvolatile memory cell of FIGS. 3A~3C are explained with reference to FIGS. 4–6. In the method for programming and/or verifying the nonvolatile memory cell, a current detection method and a voltage detection method may be used. For convenience, the current detection method will be explained. FIG. 4 illustrates a diagram showing a process of the current detection method and a system for programming the nonvolatile memory cell. The diagram shown in FIG. 4 includes a first voltage source 39, a second voltage source 40, a third voltage source 41, a fourth voltage source 42, current detector 43 and a selected nonvolatile memory cell 100 (shown in FIGS. 3A~3B) of a memory device. The label Ps represents an i-th level programming start signal applied externally, and the label $V_{ST}$ represents a programming stop signal.

The first voltage source 39 provides a voltage $V_{C,i}$ (i=0, 1, 2, - - -, n-1) to the control gate 33 of the nonvolatile memory 100 for i-th level threshold voltage programming during a multi-level programming operation. Accordingly, the value of the first voltage $V_{C,i}$ varies with every threshold level programming. The second voltage source 40 provides a second voltage $V_{PS}$ to the program/select gate 31 for a single or a multi-level threshold voltage programming. The voltage $V_{PS}$ may vary, but has a constant positive voltage value at the end of the programming time. The third voltage source 41 induces a third potential or voltage $V_D$ at the drain 37 and a current detector 43 monitors a programmed state during a single or a multi-level. programming, i.e., for monitoring a current $I_{D,i}(t)$ at the drain 37, and the fourth voltage source 42 applies a fourth voltage $V_S$ to the source 42. The fourth voltage $V_S$ may be either a ground voltage or a voltage lower than the third voltage $V_D$. The label $I_{D,i}(t)$ represents a value of the current flowing through the drain 37 over time.

The current detector 43 issues the programming stop signal $V_{ST}$ during i-th threshold voltage level programming when the value of the current $I_{D,i}(t)$ flowing through the drain 37 reaches to a reference current value $I_{REF}$ (for example, corresponding to a reference voltage $V^F_{REF}$ at the floating gate 32). A time $t_{p,i}$ represents the completion time of the programming operation. The threshold current $I_{TH}$ is dependent on the electrical characteristics of the nonvolatile memory cell. The threshold current $I_{TH}$ may be defined as a threshold voltage $V_{TH}$ necessary for current to flow in the nonvolatile memory cell. The current value $I_{D,i}(t)$ at the drain 37 may be re-defined as a current value dependent on time. This current value $I_{D,i}(t)$ represents a current at the drain 37 determined by a voltage $V_{F,i}(t)$ at the floating gate 32 during i-th threshold voltage level programming, which has a very small leakage current value due to a turn-off state (=a subthreshold state) of the channel at an initial stage of the programming operation. The turn-off state is maintained as the programming proceeds until the turn-on of the channel such that the current value increases. When the increased current value $I_{D,i}(t)$ reaches the reference current $I_{REF}$ of the current detector 43, the current detector 43 generates the programming stop signal $V_{ST}$.

Figure 6:
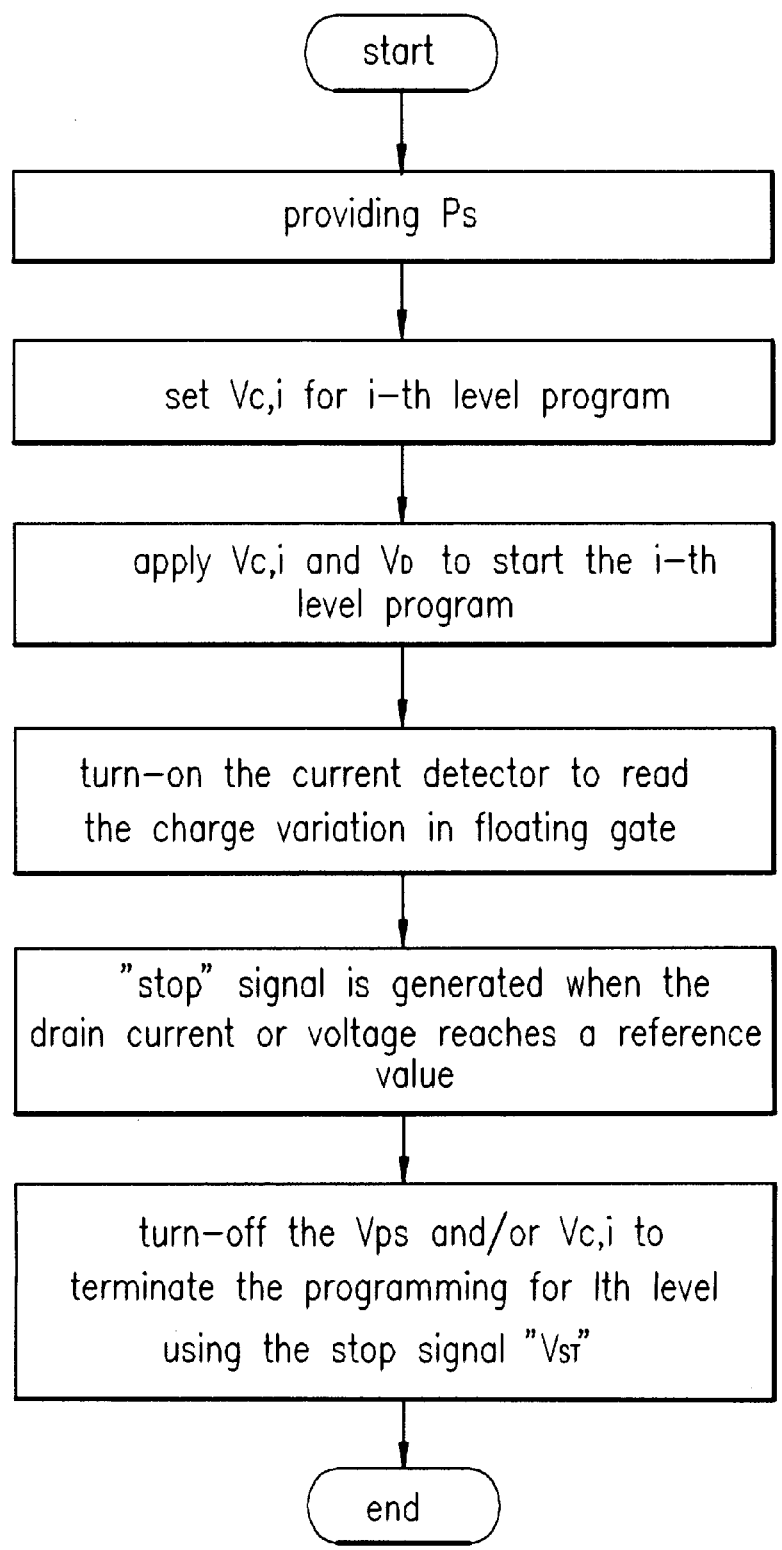
FIG. 6 illustrates a flowchart showing a single or multilevel programming process in accordance with the present invention.

FIGS. 5A~5H illustrate waveform diagrams showing waveforms at different nodes of FIG. 4, and FIG. 6 illustrates a flowchart of a single or multi-level threshold voltage programming process for an N-type FET in accordance with the present invention. Prior to the programming operation, the cell is under an erased state, and the erased state may be the highest threshold voltage level. As can be appreciated, a P type FET having a P type channel formed on an n type substrate may be assumed. In such a case, the same operation can be performed with opposite polarities of the applied voltages, and the corresponding node and threshold voltages are opposite from the N-type FET.

Upon application of an external programming start signal Ps for single or multi-level programming, a positive voltage Ps for the i-th level programming is applied to the control gate 33, as shown in FIG. 5A. Simultaneously, the current detector 43 is set up for verifying a variation of charge amount at the floating gate 32. Concurrent with the application of the programming start signal Ps (FIG. 5A), a positive voltage $V_{PS}$ (FIG. 5B) and a negative voltage $V_{C,i}$ (FIG. 5C) are applied from the first voltage source 39 and the second voltage source 40 to the control gate 33 and the program/select gate 31, respectively. Accordingly, a tunneling voltage $V_{tun,i}(t)$ exists between the program/select gate 31 and the floating gate 32, and negative charges from the floating gate 32 are transferred by tunneling to the program/select gate during the i-th threshold voltage level programming.

Simultaneously or after the application of the voltages $V_{C,i}$ and $V_{PS}$ to the control gate 33 and the program/select gate 31 respectively, the drain voltage $V_D$ and the source voltage $V_S$ are applied to the drain 37 and the source 36 from the third Y voltage source 41 and the fourth voltage source 42, respectively, and the current detector 43 is activated. Upon application of the voltages $V_{C,i}$, $V_{PS}$ and $V_D$ to the control gate 33, the program/select gate 31 and the drain 37, respectively, a voltage $V_{F,i}(t)$, as shown in FIG. 5D, on the floating gate 32 changes during the i-th threshold voltage level programming. The voltages $V_{C,i}$ and $V_{PS}$ have appropriate potentials so that an initial floating gate voltage $V_{F,i}$ turns off the channel region 38 of the FET, i.e., the initial floating gate voltage $V_{F,i}(t)$ is lower than the threshold voltage $V^F_{TH}$ at the floating gate 32.

Accordingly, there is no current flow through the drain 37 at the initial stage. As the programming operation proceeds, electrons are transferred, e.g., extracted, from the floating gate 32 to the program/select gate 31, to increase the floating gate voltage $V_{F,i}(t)$. When the floating gate voltage reaches the threshold voltage $V^F_{TH}$, as shown in FIG. 5D, the current $I_{D,i}(t)$, shown in FIG. 5E, flows through the drain 37. The current detector 43 monitors this drain current value $I_{D,i}(t)$ during the i-th threshold level programming. When the drain current $I_{D,i}(t)$ reaches a predetermined value $I_{REF}$, shown in FIG. 5E, the i-th threshold voltage level programming operation is completed, and a programming stop signal $V_{ST}$, shown in FIG. 5F, is generated.

The monitoring of the current $I_{D,i}(t)$ at the drain by the current detector 43 is equivalent to monitoring the variation of voltage or charge amount at the floating gate 32, which is extracted from the floating gate 32 to the program/select gate 31 during the programming operation, as shown in FIG. 5D. Similarly, the monitoring of the current $I_{D,i}(t)$ may be equivalent to a monitoring of a conductivity in the channel region 38.

When the programming stop signal $V_{ST}$ is applied to the first and second voltage sources 39 and 40, the first and/or second voltage sources 39 and 40 stop the application of a negative voltage $V_{C,i}$ and a positive voltage $V_{ps}$ to the control gate 33 and the program/select gate 31, respectively. In other words, once the current $I_{D,i}(t)$ is detected to be equal to or higher than the reference current at time $t=t_{p,i}$, the i-th threshold voltage level programming is completed. Therefore, the time $t_{p,i}$ represents the time for programming i-th threshold level in the cell.

As shown in FIG. 5E, when the drain current $I_{D,i}(t)$ reaches the reference current $I_{REF}$, the floating gate voltage reaches a reference voltage $V^F_{REF}$ corresponding to the reference current $I_{REF}$. The threshold current $I_{TH}$ is set to a value corresponding to the threshold voltage $V^F_{TH}$ at the floating gate 32, which is determined in advance during the fabrication of a nonvolatile memory. Since the storage field effect transistor 34 for verifying includes the floating gate 32 and the source 36, as shown in FIGS. 3A–3C, the threshold voltage $V^F_{TH}$ actually corresponds to the threshold voltage of the channel region 38.

FIG. 5H is a graph showing a variation of threshold voltages $V^C_{TH,1}$ and $V^C_{TH,2}$ at the control gate 33 for the i-th threshold level of one and two, respectively. FIG. 5H also shows that the threshold voltage $V^C_{TH,i}$ at the control gate 33 changes, e.g., decreases, as the order of the level varies, e.g., decreases, during the multi-level programming, which can be done by varying, e.g., decreasing, the voltage $V_{C,i}$ during programming. The first and second level program times $t_{p,i}$ and $t_{p,2}$ are different because the variations of the control gate voltage $V_{C,i}$ and threshold voltage $V^C_{TH,i}$ of the respective threshold voltage levels are different.

FIG. 5G is a graph showing charge amount variations at the floating gate 32 from an initial charge amount $Q_{F,0}(0)$ to (1) the charge amount $Q_{F,1}(t_{P,1})$ at the time when the first threshold voltage level programming is completed, and (2) the charge amount $Q_{F,2}(t_{P,2})$ at the time when the second threshold voltage level programming is completed. When the voltages $V_{F,1}(t)$ and $V_{F,2}(t)$ at floating gate 32 reach the reference voltage $V^F_{REF}$, corresponding to the reference current $I_{REF}(t=t_{P,1}, t=t_{P,2})$, the charge amount at floating gate 32 is decreased from the initial amount $Q_{F,0}(0)$ to amount $Q_{F,1}(t_{P,1})$ and to amount $Q_{F,2}(t_{P,2})$, respectively. After the completion of the programming operation, values of the charge amount $Q_{F,1}(t_{P,1})$, $Q_{F,2}(t_{P,2})$, etc. are maintained in the floating gate 32 to induce the programmed threshold voltage level on the control gate 33.

FIGS. 5A–5F also illustrate the programming and/or verification method for I-th threshold voltage programming when I=1 and 2. As shown in FIG. 5B, control gate voltages $V_{C,1}=V$ and $V_{C,2}=V-\Delta V$ are applied during the first and second (I=1 and 2) threshold level programming. Due to the different voltages applied at the control gate 33, the voltages $V_{F,1}(t)$ and $V_{F,2}(t)$ at the floating gate 32 rise at different rates. The currents $I_{D,1}(t)$ and $I_{D,2}(t)$ remain at about zero until the voltage $V_{F,1}(t)$ and $V_{F,2}(t)$ at the floating gate 32 reaches the threshold voltages $V^F_{TH}$. As the voltages $V_{F,1}(t)$ and $V_{F,2}(t)$ continue to increase, the currents $I_{D,1}(t)$ and $I_{D,2}(t)$ increase to $I_{REF}$, and the stop signals $V_{ST,1}$ and $V_{ST,2}$ are generated when $I_{D,1}(t_{p,1})$ and $I_{D,2}(t_{p,2})$ equal $I_{REF}$.

As shown in FIG. 5D and 5E the programming stop signal is generated when the currents $I_{D,1}(t_{p,1})$ and $I_{D,2}(t_{p,2})$ equal $I_{REF}$. The time period t depends on the programming characteristics of the given device.

Further, as can be appreciated, the reference current $I_{REF}$ (or reference voltage $V_{REF}$) may be the threshold current $I_{TH}$ (or threshold voltage $V^F_{TH}$) or any arbitrary value greater than the threshold current $I_{TH}$.

Figure 7A:
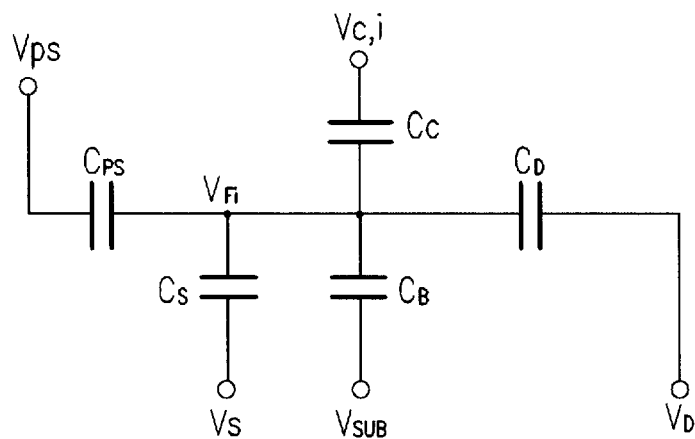
FIG. 7A illustrates a capacitance equivalent circuit of the nonvolatile memory cell shown in FIG. 3A.

Referring to FIG. 7A, the relationship between the voltage $V_{C,i}$ applied from the first voltage source 39 to the control gate 33 and the threshold voltage of the corresponding level, which is a significant result of the present invention, will be explained. FIG. 7A illustrates a capacitance equivalent circuit of the nonvolatile memory shown in FIG. 3. In FIG. 7A, the label $C_C$ represents the capacitance between the control gate 33 and the floating gate 32, the label $C_{ps}$ represents a capacitance between the program/select gate 31 and the floating gate 32, the label $C_D$ represents the capacitance between the drain 37 and the floating gate 32, the label $C_S$ represents the capacitance between the source 36 and the floating gate 32 and the label $C_B$ represents the capacitance between the substrate and the floating gate 32.

SUM $C_T$ of those capacitances can be expressed by the following equation (1):

$$C_T = C_C + C_{ps} + C_D + C_S + C_B \qquad (1)$$

The coupling coefficients of the respective capacitances are defined by the following equations (2):

$$\chi_D = C_D/C_T,\ \alpha_C = C_C/C_T,\ \alpha_{ps} = C_{ps}/C_T,\ \alpha_S = C_S/C_T \text{ and } \alpha_B = C_B/C_T \qquad (2)$$

For convenience, the substrate and source voltages are assumed to be ground voltages, and the capacitances $C_S$, $C_B$ and coupling coefficients $\alpha_S$ and $\alpha_B$ can be ignored. The voltage at floating gate 32 during programming can be expressed by the following equation (3):

$$V_F(t) = \alpha_C V_C + \alpha_{ps} V_{ps} + \alpha_D V_D(t) + Q_F(t)/C_T \qquad (3)$$

$$= \alpha_C [V_C - V_{TH}^C(t)] + \alpha_{ps} V_{ps} + \alpha_D V_D(t)$$

where $Q_F(t)$ represents an amount of charges at the floating gate 32.

In programming and/or verification, the threshold voltage $V^C_{TH}(t)$ at the control gate 33, induced by amount of charge carriers at the floating gate 32, is defined by the following equation (4):

$$V_{TH}^C(t) = -\frac{Q_F(t)}{C_c} \qquad (4)$$

As indicated in equation (4), the threshold voltage $V^C_{TH}(t)$ is a threshold voltage shift induced by charge amount $Q_F$ at the floating gate 32 measured at the control gate 33 at time t. The threshold voltage shift refers to a threshold voltage measured at the control gate 33, which is caused by the charges accumulated at the floating gate 32.

The threshold voltage $V^F_{TH}$ at the floating gate 32 is an inherent threshold voltage of the storage field effect transistor consisting of the floating gate 32, source 36, and drain 37 as shown in FIG. 3, which is dependent on manufacturing conditions, such as channel ion implantation and thickness of a gate insulator in fabricating the nonvolatile memory cell of FIG. 3. Therefore, the threshold voltage $V^F_{TH}$ of the floating gate 32 is always a constant. However, threshold voltage $V^C_{TH}$ at the control gate 33 is dependent on a amount of charge $Q_F$ at the floating gate 32.

Each programming and/or verification operation of each level is halted when the voltage $V_F(t)$ at the floating gate 32 reaches the reference voltage $V^F_{REF}$ at the floating gate 32 (for example, the threshold voltage $V^F_{TH}$ or an arbitrary reference voltage $V^F_{REF}$). When the drain voltage $V_D$ is constant, the level of current flow $I_D(t)$ is dependent on the voltage at the floating gate 32, and has a one to one relationship with the voltage $V_{F,i}$ at the floating gate 32. Accordingly, the programming and/or verification stop time point for each level corresponds to the time when the current $I_D(t)$ reaches the reference current $I_{EF}$. Therefore, in each threshold voltage level programming and/or verification, the voltage $V_F(t_P)$ of the floating gate. 32 at the completion time of programming and/or verification completion for each level can be expressed by the following equation (5):

$$V_F(t_P) = V^F_{TH} = \alpha_C [V_C - V^C_{TH}(t_P)] + \alpha_{ps} V_{ps} + \alpha_D V_D(t_P) \qquad (5)$$

Rearranging the equation (5) with regard to the voltage $V_C$ applied from the first voltage source 39 to the control gate 33, the following equation (6) is given:

$$V_{TH}^C(t_P) = V_C + \frac{\alpha_{ps} V_{ps} + \alpha_D V_D - V^F_{REF}}{\alpha_C} = V_C + V1 \qquad (6)$$

where V1 is defined as:

$$V1 = \frac{\alpha_{ps} V_{ps} + \alpha_D V_D - V^F_{REF}}{\alpha_C} \qquad (7)$$

If the three parameters of the program/select gate voltage $V_{ps}$, drain voltage $V_D$ and reference voltage $V^F_{REF}$ are adjusted to make the V1 a fixed constant at the completion time of each level programming and/or verification, the relationship of the control gate voltage $V_{C,i}$ and the threshold voltage $V^C_{TH,i}$ is linear to each other.

One of the ways of making the voltage V1 a fixed constant is to make each of the program/select gate voltage $V_{ps}$, the drain voltage $V_D$ and the reference voltage $V^F_{REF}$ a fixed constant for each threshold voltage level programming and/or verification. Making the reference voltage $V^F_{REF}$ constant is the same with making the reference current $I_{REF}$ constant. However, as can be noted in equation (5), the values of each of the program/select gate voltage $V_{ps}$ and the drain voltage $V_D$ can be constant if their values are the same at the completion time of each level programming and/or verification. In other words, although the program/select gate voltage $V_{ps}$ and the drain voltage $V_D$ may be variables dependent on time, the object of the present invention can be achieved if the voltages $V_D$ and $V_{ps}$ at the completion time of each level programming and/or verification are the same. As shown from equation (5), the control gate voltage $V_{C,i}$ at each i-th level also can be a variable dependent on time. In such a case, the voltage $V_C$ in equation (5) is a value at the completion time of each level programming and/or verification.

By making V1 a constant for each level programming, the control gate voltage $V_{C,i}$ required for i-th threshold level programming can be expressed according to equation (6) as the following:

$$V^C_{TH,i} = V_{C,i} + V1 \text{(where } i=0, 1, 2, 3, \ldots n-1) \qquad (8)$$

Figure 7B:
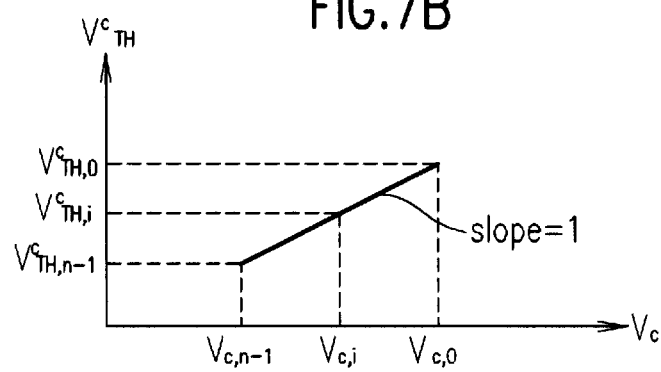
FIG. 7B illustrates a relation between threshold levels to be programmed and correspondingly applied control gate voltages, and a relation in a multi-level programming between an initial floating gate voltage for each level and reference currents.

As shown in equation (8), the threshold voltage levels to be programmed and the control gate voltages applied are linear with a slope of, e.g., 1, as shown in FIG. 7B. According to equation (4), the charge amounts in the floating gate 32 are also linear with respect to the control gate voltages.

Since the voltage $V_1$ is a constant as mentioned above, a shift $\Delta V_{C,i}$ of the voltage applied to the control gate 33 during a multi-level programming can be expressed directly in the following equation (9):

$$\Delta V_{C,i} = \Delta V^C_{TH,i} \qquad (9)$$

From equations (8) and (9), it can be shown that a shift of a threshold voltage level $V^C_{TH,i}$ to be programmed can be accurately controlled by a shift of the control gate voltage $V_{C,i}$ in single or multi-level programming and/or verification. It can be shown that the control gate voltage becomes the threshold voltage when the constant shown in the equation (7) is set to zero.

The following two methods for monitoring a programming in case the above conclusion may be applicable to the programming of a nonvolatile memory.

The first method is a channel ON-TO-OFF method in which the channel is turned on at an initial stage of the programming to cause the greatest amount of drain current to flow. The charge carriers, e.g., electrons are injected into the floating gate during the programming and/or verification operation to cause the floating gate voltage to decrease with subsequent decrease of the drain current until the drain current reaches a predetermined reference current.

The second method is a channel OFF-TO-ON method, which is opposite to the channel ON-TO-OFF method, in which voltages are applied to each electrode for not only turning off the channel 38 at an initial stage of a programming operation, i.e., for causing the floating gate voltage to be lower than the floating gate threshold voltage $V^F_{TH}$ but also for causing the charge carriers, such as electrons, to be transferred from the floating gate 32 to the program/select gate 31. As the programming proceeds, the voltage in the floating gate rises to reach a voltage higher than the floating gate threshold voltage $V^F_{TH}$ at the end when the channel is turned on. A stop point of the programming may be a moment when the channel is turned on or may be any arbitrary time after the turn on. In other words, the reference current $I_{REF}$ may be the threshold current, or may be any arbitrary value greater than the threshold current $I_{TH}$, as discussed above.

Figure 7C:
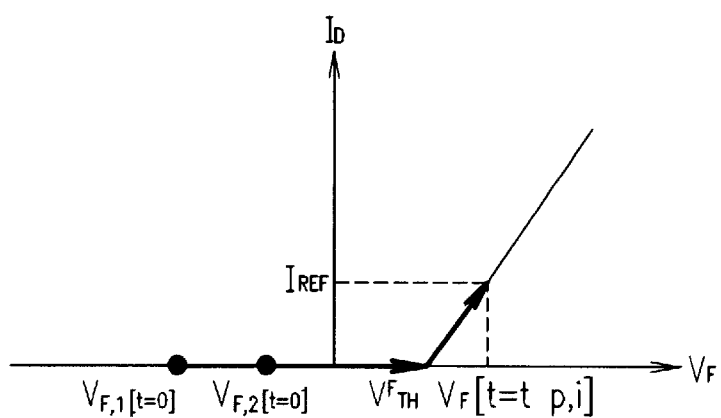
FIG. 7C illustrates a graph showing turn-on/turn-off points of a transistor and a relation between a programming end point and a drain current in a multi-level programming.

For multilevel programming and/or verification operation, as the control gate voltages, which corresponds to each of the threshold voltage levels, are varied, each of the initial floating gate voltages $V_{F,i}(t=0)$ of each level programming also are varied, which is shown well in FIG. 7B. For each level programming and/or verification, the $V^F_{REF}$ (or $I_{REF}$) is a constant, and the $V_{C,i}$ decreases as the i-th level changes, e.g., goes to a higher order. The drain current before the turn-on is substantially zero, and the turn on point and the programming and/or verification completion point are dependent on characteristics of a transistor, which is shown in FIG. 7C.

The present invention is related to the aforementioned OFF-TO-ON method, and a new nonvolatile memory cell, device and memory array to which the OFF-TO-ON method can be applicable with ease. In comparison to the ON-TO-OFF method, the OFF-TO-ON method has a very small power consumption. When an ON moment corresponding to the threshold voltage is detected as the programming stop point, a sense amplifier may be implemented very simply.

From the above, e.g., in the OFF-TO-ON method programming, when a shift $\Delta V^C_{TH,i}$ from the erased state, which is the highest level, to one of the corresponding threshold levels is determined, a programming and/or verification for the level can be done by applying a value obtained by subtracting the shift $\Delta V^C_{TH,i}$ to a desired level from already known highest level $V_{C,0}$ value used in programming as a control gate voltage, and then waiting until the automatic completion of the programming and/or verification is done by a detection circuit (the current detector 43, in case of this embodiment).

If a tunneling mechanism is used for programming, a positive voltage is applied to the select/program gate 31, a negative voltage is applied to the control gate 33, and a minimum voltage (for example, 1 V) sufficient to monitor (sense) a current between the drain 37 and source 36, to turn on the select transistor 35 and to establish an electric field which is large enough to cause tunneling between the floating gate 32 and the program/select gate 31. The select transistor 34 should be turned on because monitoring of a state of the channel (a conductivity), i.e., a drain current is possible during programming.

Methods for determining the control gate voltage $V_{C,0}$ and the reference current $I_{REF}$ for use in the highest level programming will be explained. Once the desired highest level $V^C_{TH,0}$, the select/program gate voltage $V_{PS}$, drain voltage $V_D$, source voltage $V_S$ and a substrate voltage $V_B$ of a given memory cell are determined, the two parameters of the highest level value/voltage $V_{c,0}$ and the reference voltage $V^F_{REF}$ are left from equations (7) and (8). Since the select/program gate voltage $V_{ps}$, drain voltage $V_D$ and source voltage $V_S$ are fixed, the reference voltage $V^F_{REF}$ has a one to one correspondence to the reference current $I_{REF}$. When the desired voltages $V^C_{TH,0}$, $V_{C,0}$, $V_{PS}$, $V_D$, $V_S$ and $V_B$ are applied to the memory cell, an initial drain current $I_{D,0}(0)$ is measured. The current $I_{D,0}(0)$ at this time is the same as $I_{REF}$. In this case, the voltage $V_{C,0}$ is determined by taking the programming time into consideration. Once the voltage $V_{C,0}$ is determined, the reference current $I_{REF}$ can be determined by the aforementioned method. As can be appreciated by one of ordinary skill in the art, the reference current $I_{REF}$ may be measured by various methods other than the above.

In the above, the voltage V1 expressed in equation (7) is set as a fixed constant. As can be appreciated, the parameters in the equation (7) may be adjusted to vary the voltage V1 for every threshold voltage level programming. As can be seen from the equation (8), the control gate voltage $V_{C,i}$ and the corresponding threshold voltage level $V^C_{TH,i}$ will have a nonlinear relationship. Accordingly, a shift of the control gate voltage $V_{C,i}$ and a shift of the corresponding threshold voltage $V^C_{TH,i}$ have values different from each other. In such a case, by adjusting the reference current $I_{REF}$ appropriately for every level, the threshold voltages for each level can be programmed to desired values after the nonlinear relationship of the control gate voltage $V_{C,i}$ and the corresponding threshold voltage $V^C_{TH,i}$ is obtained.

As previously discussed, an erasure is an injection of charge carriers (or electrons) into the floating gate. Therefore, the erasure can be done either with hot carrier injection or with tunneling. In the present invention, the erased state results in a threshold level to be the highest, i.e., $V^C_{TH,0}$ in the nonvolatile memory. In other words, all the nonvolatile memory cells within a given erasure block are programmed at the highest level. Accordingly, an erasure process can be done according to the following steps using, for example, an N-type transistor.

First, electrons are injected so that threshold levels of all the cells within a selected block become higher than the 0-th level, i.e., $V^C_{TH,0}$. With the 0-th level in which the voltage of control gate 33 is $V_{C,0}$, all the selected cells are programmed. Here, as has been explained, the value of the $V_{C,0}$ may be arbitrarily chosen.

In case of a programming method of the present invention is applied to a P type transistor, a similar result can be obtained by changing the polarities of applied voltages. However, the decrease of the floating gate voltage due to injection of electrons thereto causes the transistor to go from turn off to turn on. Therefore, voltages should be applied to each gate and terminal such that the channel is turned off at an initial stage and electrons are injected into the floating gate over a period of time.

As the novel feature of the present invention explained up to now are explained irrespective of the programming mechanism, it can be appreciated that the novel feature of the present invention may be applicable to other types of programming mechanism.

Figure 8A:
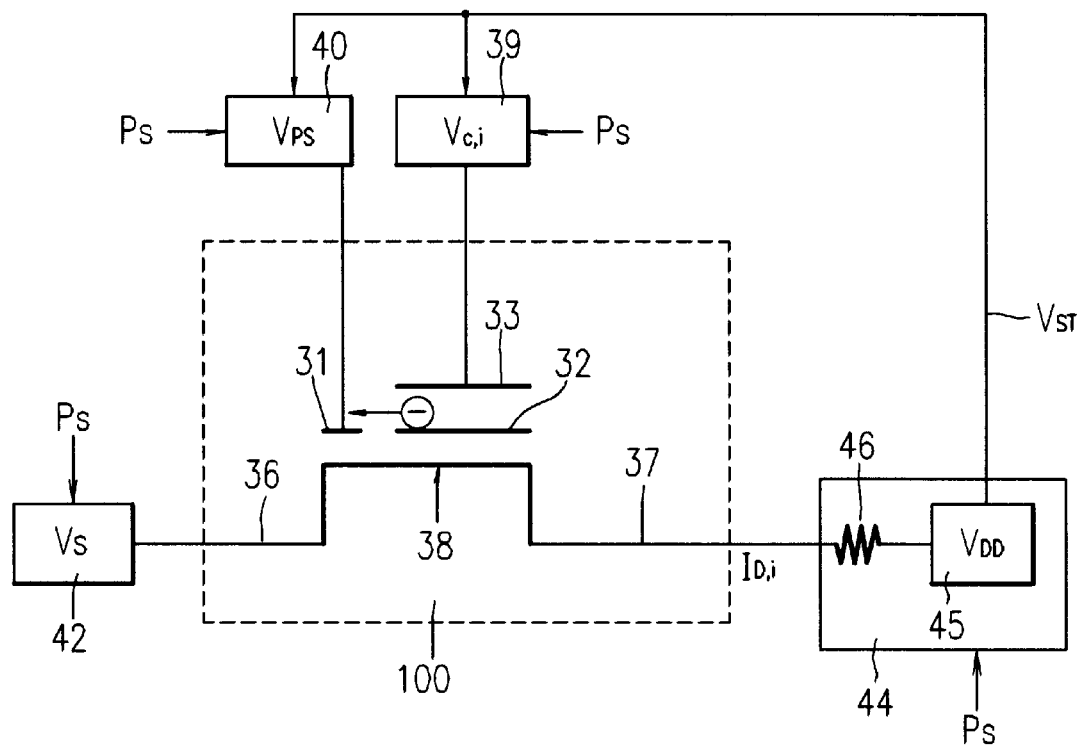
FIG. 8A is a diagram for explaining a process for programming a nonvolatile memory cell using the voltage detection method in accordance with the present invention.
Figure 8B:
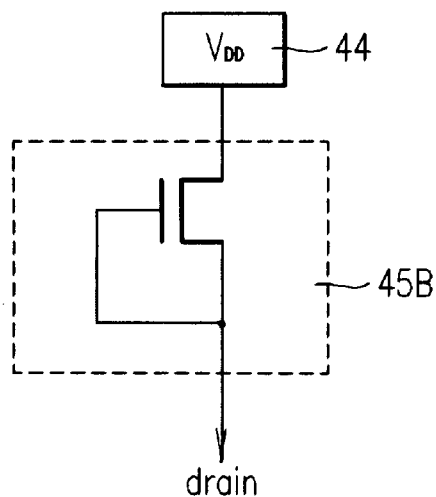
FIG. 8B illustrates a circuit showing another embodiment of the voltage detector shown in FIG. 8A.

FIGS. 8A and 8B illustrate the programming and/or verification method using voltage detection rather than current detection. The programming and/or verification method according to the voltage detection method is similar to the programming and/or verification method using current detection. For example, rather than using a current detector of FIG. 4, a voltage detector 44 is employed, as shown in FIG. 8A. In this embodiment, the voltage detector 44 includes a reference voltage source 45 and a resistor 46 connected between the reference voltage source 45 and the drain 37. Alternatively, the voltage detector 44 may include the reference voltage source and a transistor diode 45B connected between the reference voltage source and the drain, as shown in FIG. 8B.

The voltage detector 44 monitors a voltage of the drain 37 during programming and/or verification. Upon detection of the drain voltage $V_{D,TH}$ when a voltage $V_{F,i}$ at the floating gate 32, which is monitored, reaches a given threshold voltage $V^F_{TH}$, the voltage detector 44 generates a programming stop signal $V_{ST}$. The drain voltage $V_{D,TH}$ is a constant throughout all levels of programming and/or verification. Similar to the current detection method, if the first voltage source 39 and/or the second voltage source 40 stop supplying the control gate voltage $V_{C,i}$ and the program gate voltage $V_{ps}$, respectively, in response to this programming stop signal $V_{ST}$, the programming and/or verification is ended. Since other features of the voltage detection method is similar to the current detection method, those explanations will be omitted.

Figure 9A:
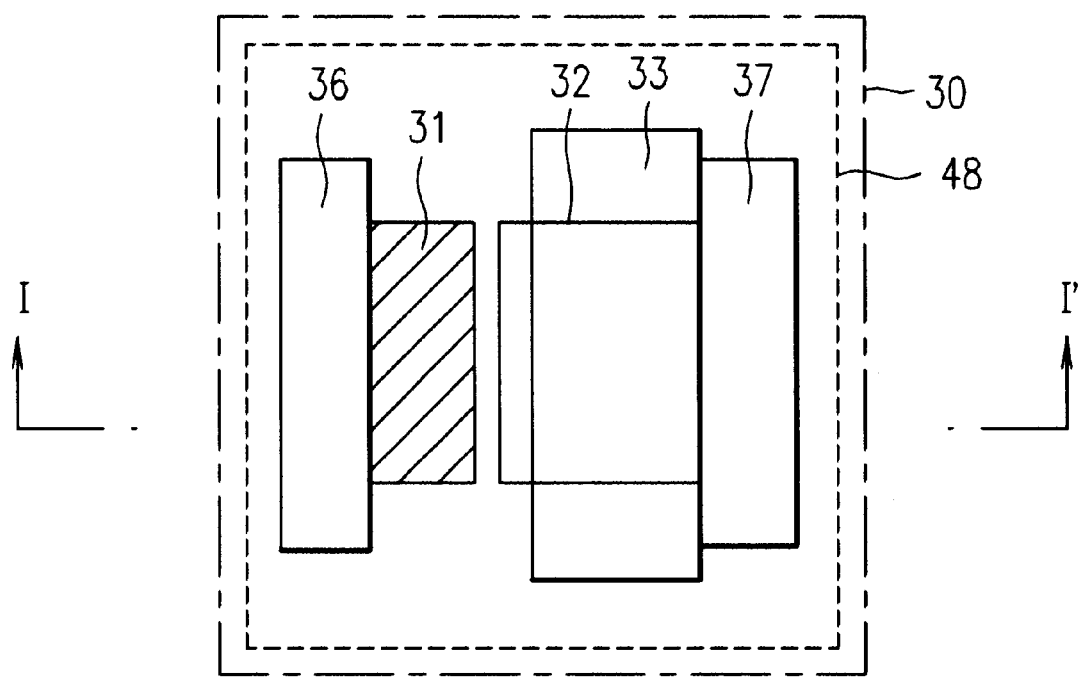
FIG. 9A illustrates a first form structure of the nonvolatile memory cell in accordance with the present invention.
Figure 9B:
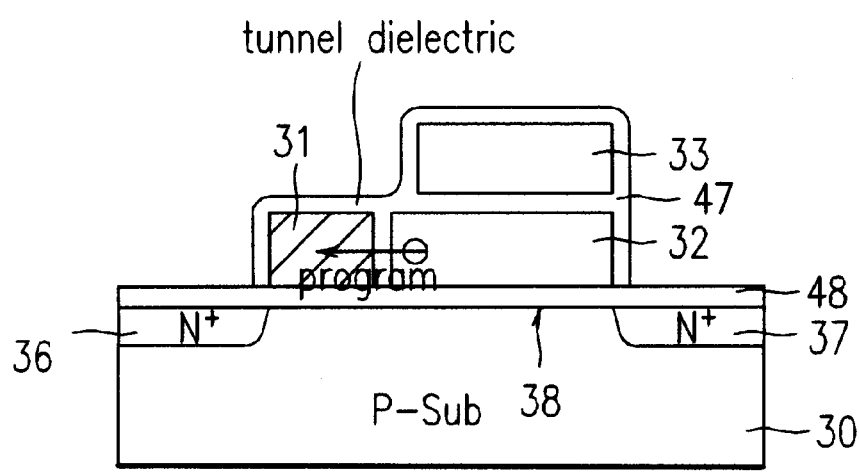
FIG. 9B illustrates a section across line I–I' in FIG. 9A.

FIG. 9A illustrates a structure of the nonvolatile memory cell in accordance with a first embodiment of the present invention, and FIG. 9B illustrates a section across line I–I' of FIG. 9A. The nonvolatile memory includes a first conductivity type semiconductor substrate 30 having a source 36, a drain 37 and a channel region 38 between the source 36 and the drain 37 in a surface thereof. A program/select gate 31 is formed on a source side over a surface of the channel region 38, and a floating gate 32 is formed on a drain 37 side over a surface of the channel region 38 adjacent and spaced apart from the program/select gate 31. A control gate 33 is formed over the floating gate 32, and a dielectric layer 47 is formed between the program/select gate 31, the floating gate 32 and the control gate 33. The dielectric layer 47 has an appropriate, generally thin, thickness to allow tunneling between the floating gate 32 and the program/select gate.

As shown, one side of the floating gate 32 is formed adjacent to a side of the program/select gate 31 for tunneling of electrons through the dielectric layer 47. A gate insulating film 48, having a sufficiently thin film thickness to allow tunneling of electrons from the channel region 38 to the floating gate 32, during erasure is formed between the channel region and the floating gate 32.

Figure 10A:
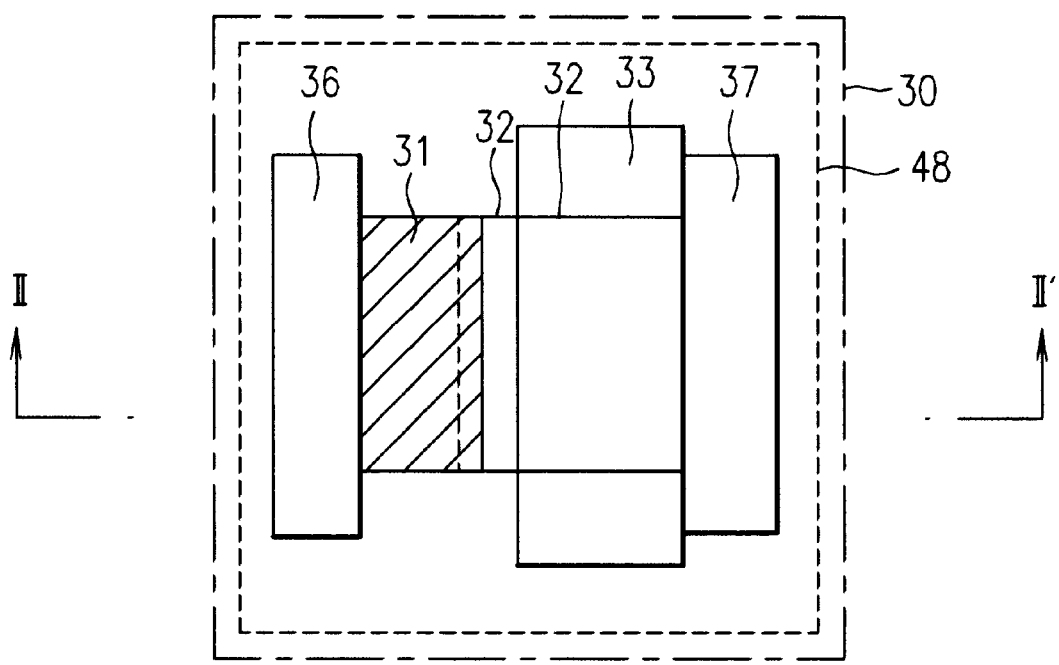
FIG. 10A illustrates a second form structure of the nonvolatile memory cell in accordance with the present invention.
Figure 10B:
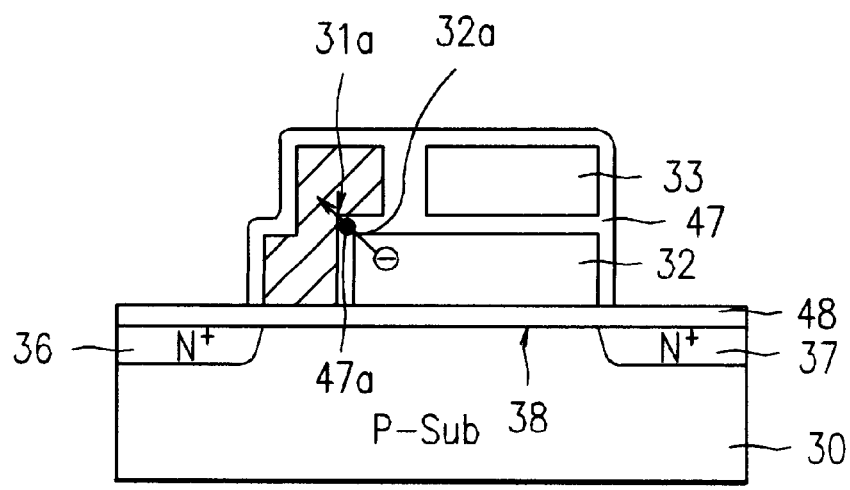
FIG. 10B illustrates a section across line II–II' in FIG. 10A.

FIG. 10A illustrates a layout structure of the nonvolatile memory cell in accordance with a second embodiment of the present invention, and FIG. 10B illustrates a section across line II–II' of FIG. 10A. The second layout structure of the nonvolatile memory cell is similar to the first structure of FIGS. 9A and 9B. In FIGS. 10A and 10B, the program/select gate 31 extends from the source 36 side to a portion over a surface of the floating gate 32. Such a layout allows extraction of electrons from an edge 32a of the floating gate 32 through the dielectric layer 47 to an edge 31a of the program/select gate 31. Such pointed edges allow better electron transfer at substantially the same or lower voltage applications. Therefore, the dielectric layer 47 has thinner thickness at an edge 47a between the program/select gate 31 and the floating gage 32 compared to other portions.

Figure 11A:
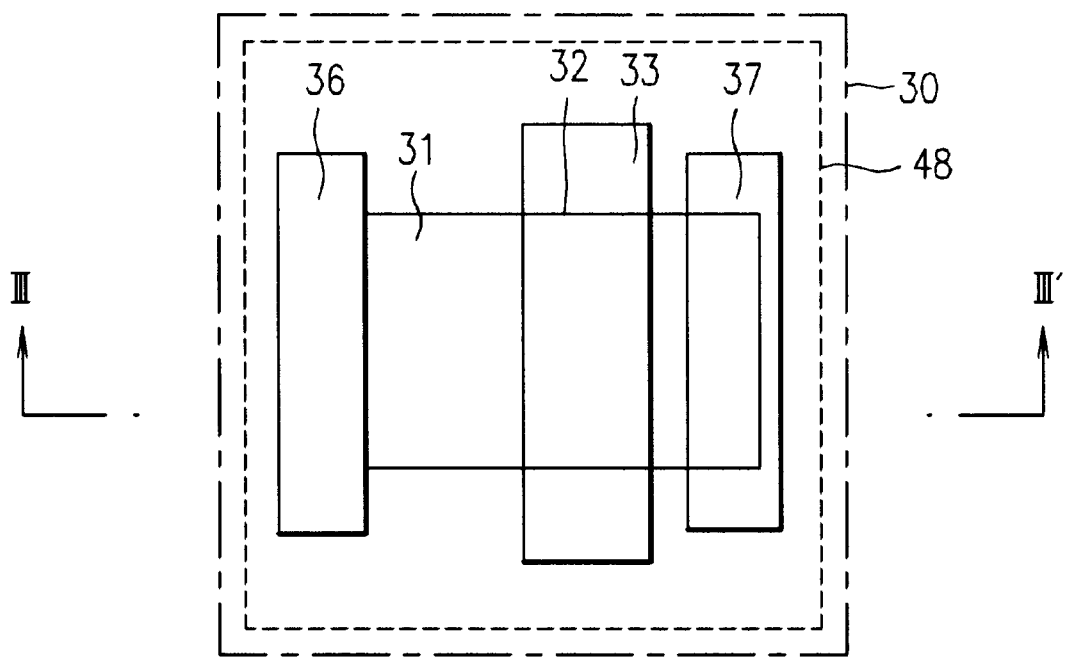
FIG. 11A illustrates a third form structure of the nonvolatile memory cell in accordance with the present invention.
Figure 11B:
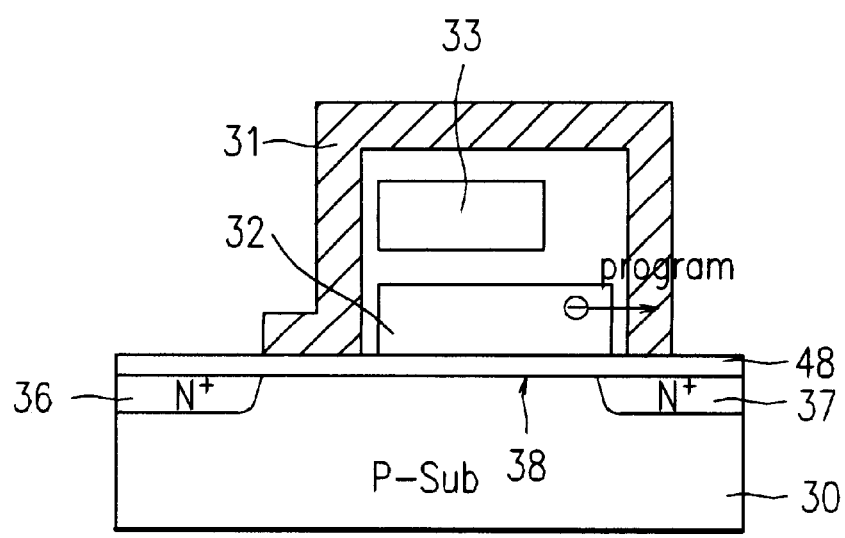
FIG. 11B illustrates a section across line III–III' in FIG. 11A.

FIG. 11A illustrates a layout structure of the nonvolatile memory cell in accordance with a third embodiment of the present invention, and FIG. 11B illustrates a section across line III–III' of FIG. 11A. As shown, the program/select gate 31 cover the upper and/or side surfaces of the floating gate 32 and the control gate 33. A source 36 and a drain 37 is formed a first conductivity type semiconductor substrate 30 with a channel region 38 therebetween, and a gate insulating layer 48 formed on the semiconductor substrate 30. A floating gate 32 is formed on a drain 37 side over a surface of the channel region 38, and a control gate 33 formed over the floating gate 32 with a width narrower than the floating gate 32. A program/select gate 31 extends from an exposed surface of the channel region 38 on a source 36 side to overlap or surround the side and/or top surfaces of the floating gate 32 and the control gate 33 and stops over a surface of the drain 37. A dielectric layer 47 is formed between the program/select gate 31, the floating gate 32 and the control gate 33 and a thickness of the dielectric layer 47 between one side of the floating gate 32 and one side of the program/select gate 31 on the drain 37 side is sufficiently thin to allow tunneling. This layout allows tunneling of electrons through the dielectric layer 47 between the program/select gate 31 and the floating gate 32.

Figure 12A:
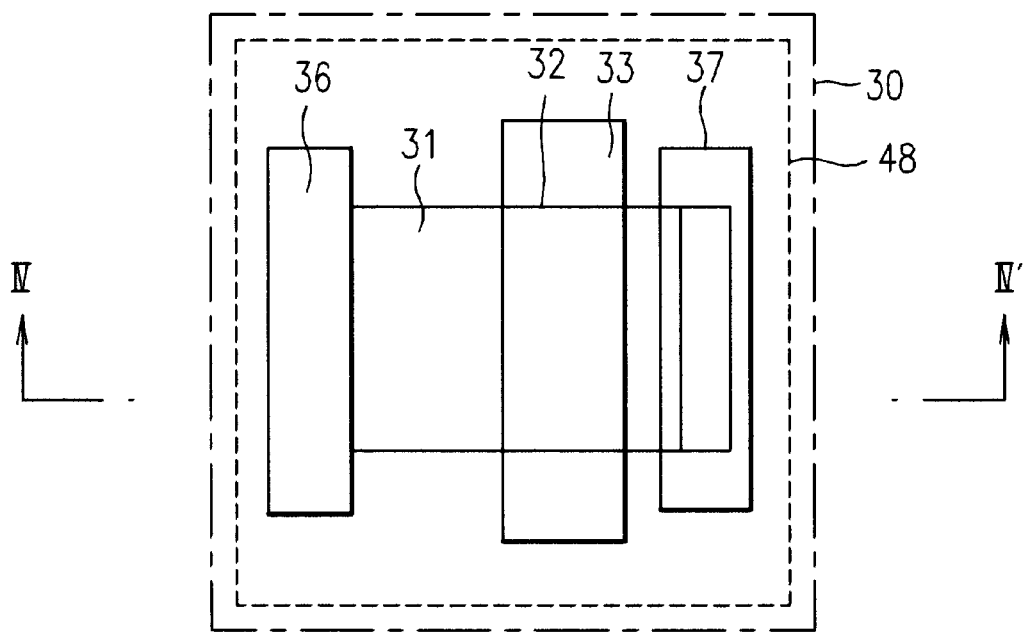
FIG. 12A illustrates a fourth form structure of the nonvolatile memory cell in accordance with the present invention.
Figure 12B:
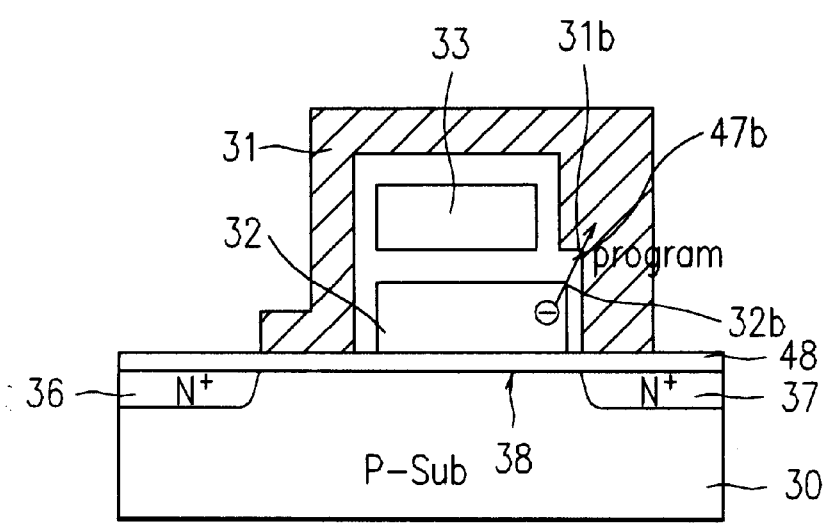
FIG. 12B illustrates a section across line IV–IV' in FIG. 12A.

FIG. 12A illustrates a layout structure of the nonvolatile memory cell in accordance with a fourth embodiment of the present invention, and FIG. 12B illustrates a section across line IV–IV' of FIG. 12A. Such a cell includes edges 31b, 32b and 47b of the program/select gate 31, the floating gate 32 and the dielectric layer 47, respectively, near the drain 37 side, at positions facing each other, to allow tunneling therethrough. Further, a thickness of the dielectric layer 47 is thinner than other parts of the dielectric layer 47.

The present invention has various advantages over the related art. For example, only a variation of the control gate voltage is required for programming and/or verifying each threshold level voltage, which facilitates single or multi-level programming and/or verification. Further, since the relationship between each of the threshold voltage levels and each of the corresponding control gate voltages is linear, and the shift of the threshold voltage is identical to the shift of the control gate voltage, an accurate adjustment of the shift of each level threshold voltage is available. The method for programming a nonvolatile memory using voltage detection also allows much easier and more accurate multi-level programming compared to the current detection.

The facilitation of simultaneous programming and/or verifying within the nonvolatile memory cell eliminates a separate circuit for verifying programming of the threshold voltages, which decreases the time for programming and reduces the overall device area. The time period is further reduced since no pre-programming prior to erasure is required. Since the source and drain can be operated to be charged with a low voltage (e.g., ~1 V) for reading, which is very favorable for cell size shrinkage. Since the programming stops when the cell goes from turn-off to turn-on, power consumption is very small.

The accuracy of multi-level programming, i.e., the error distribution of programmed threshold voltages, can be precisely controlled by (1) parameters fixed at the time of fabrication of the nonvolatile memory and (2) bias voltages to be applied. The error distribution of the respective levels of the nonvolatile memory of the present invention is not dependent on numerous program/erase cycles. Even during programming, the memory is not dependent on traps of charges in an oxide layer, channel mobility, bit line resistance, and unstable or unpredictable electric parameters.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the novel feature of the invention and its application to enable one skilled in the art to utilize the invention in various embodiments and with various modifications as are suited to a particular use. It is intended that the scope of the invention be defined by the claims appended hereto, and their equivalents.

What is claimed is:

1. A memory device comprising:
   a source, a drain and a channel region therebetween,
   a program/select gate for selecting the memory device for at least one of programming, reading and erasure;
   a floating gate for storage of charges as data, the charges being transferred to the program/select gate during programming; and
   a control gate for inducing a potential at the floating gate to control an amount of charges transferred from the floating gate to the program/select gate during programming, wherein the control gate induces the potential at the floating gate by means of a capacitive coupling.

2. The memory device of claim 1, wherein a tunneling diode is formed between the program/select gate and the floating gate to allow tunneling of charges between the floating gate and the program/select gate.

3. The memory device of claim 1, wherein
   a storage transistor is formed using a first region of the channel region between the program/select gate and the floating gate as a drain, a second region of the channel region under the floating gate as a channel region, the control gate, the floating gate, and the drain, the storage transistor serving to store data in the floating gate, and
   a select transistor is formed using the program/select gate, a third region of the channel region under the program/select gate and the source for serving as a channel region, and the first region for serving as a source and a drain, the select transistor for controlling a current flowing between the drain and source.

4. The memory device of claim 3, wherein the select transistor controls the current regardless of the threshold voltage of the storage transistor.

5. The memory device of claim 1, wherein the nonvolatile memory cell supplies charges to the floating gate during erasure by one of drain side tunneling, source side tunneling, channel side tunneling and hot carrier injection.

6. The memory device of claim 1, further comprising:
   a first voltage source for providing a first voltage to the control gate;
   a second voltage source for providing a second voltage to the program/select gate;
   a third voltage source for providing a third voltage to the drain;
   a fourth voltage source for providing a fourth voltage to the source, the fourth voltage being lower than the third voltage provided to the drain; and
   a current detector for detecting a current at the drain during programming and providing a programming stop signal to at least one of the first and second voltage sources when the current detected at the drain reaches a preset reference current value.

7. The memory device of claim 6, wherein the first voltage is a negative voltage varied in correspondence to every threshold level programming in a multi-level programming, the second voltage is a positive voltage, the third voltage is a positive voltage, and the fourth voltage is a positive voltage lower than the voltage provided from the third voltage source.

8. The memory device of claim 7, wherein the source has a ground voltage.

9. The memory device of claim 1, further comprising:
   a first voltage source for providing a first voltage to the control gate;
   a second voltage source for providing a second voltage to the program/select gate; and
   a voltage detector for monitoring a voltage at the drain during programming and providing a programming stop signal to at least one of the first and second voltage sources when the voltage monitored at the drain reaches a preset reference voltage.

10. The memory device of claim 9, wherein the first voltage is a negative voltage varied in correspondence to every threshold level programming in a multi-level programming, and the second voltage is a constant positive voltage.

11. The memory device of claim 9, wherein the voltage detector includes a reference voltage source for providing the preset reference voltage, and a resistor connected between the reference voltage source and the drain.

12. The memory device of claim 9, wherein the voltage detector includes a reference voltage source for providing a preset reference voltage, and a diode connected between the reference voltage source and the drain.

13. nonvolatile memory comprising:
    a plurality of memory cells, each memory cell having
      a channel region, a source and a drain,
      a program/select gate for selecting memory cell during at least one of programming, reading and erasure;
      a floating gate for storing charges as data and a current programming path existing between the floating and program/select gates such that the charges are transferred from said floating gate to the said program/select gate during programming of a threshold voltage level; and
      a control gate for inducing a potential at the floating gate to control an amount of the charges transferred from the floating gate to the program/select gate, wherein a current flow between the source and drain through the channel forms a current monitoring path such that the current monitoring path and the current programming path are completely separate during the programming of the threshold voltage level.

14. The nonvolatile memory cell of claim 13, wherein the monitoring of the current monitoring path includes monitoring of a conductivity of the channel according to a variation of an amount of charges in the floating gate.

15. The nonvolatile memory cell of claim 13, wherein the monitoring of the current monitoring path includes monitoring a current in one of the source and the drain.

16. The nonvolatile memory cell of claim 13, further comprising a sense amplifier for monitoring the threshold voltage level.

17. A semiconductor device, comprising:
    first and second electrodes and a channel region therebetween;
    a first gate for accumulating an amount of charge carriers;
    a second gate for selection the semiconductor device for a prescribed operation including programming a threshold voltage level of the semiconductor device; and
    a third gate for inducing a transfer of carriers carrier from said first gate to said second gate during programming operation, wherein a first current path due to the transfer of charge carriers is separate from a second current path due to a current flowing between said first and second electrodes.

18. The semiconductor device of claim 17, wherein
said first and second electrodes comprises first and second regions of a first conductivity type in a semiconductor substrate of a second conductivity type with channel region, corresponding to the channel being formed between the first and second regions;

said first gate being insulated and formed across a first portion of said channel region;

said second gate being insulated and formed across a second portion of said channel region, said second gate being adjacent to said first gate; and said third gate being insulated and formed across said first gate, wherein charge carriers are transferred from said first gate to said second gate through a insulating film formed therebetween by at least one of hot carrier injection and tunneling.

19. The semiconductor device of claim 18, wherein said second gate includes at least one of a point edge to facilitate at least one of hot carrier injection and tunneling.

20. The semiconductor device of claim 18, wherein said second gate includes a part which overlaps a prescribed portion of a surface of said first gate and adjacent to said third gate.

* * * * *